(12) United States Patent
Kim

(10) Patent No.: US 7,969,086 B2
(45) Date of Patent: Jun. 28, 2011

(54) ORGANIC LIGHT EMITTING DISPLAY APPARATUS

(75) Inventor: Eun-Ah Kim, Suwon-Si (KR)

(73) Assignee: Samsung Mobile Display, Co., Ltd. (KR)

( * ) Notice: Subject to any disclaimer, the term of this patent is extended or adjusted under 35 U.S.C. 154(b) by 717 days.

(21) Appl. No.: 11/742,436

(22) Filed: Apr. 30, 2007

(65) Prior Publication Data

US 2008/0030128 A1 Feb. 7, 2008

(30) Foreign Application Priority Data

Jun. 7, 2006 (KR) .................. 10-2006-0050875

(51) Int. Cl.
*H01L 51/52* (2006.01)
(52) U.S. Cl. .................. 313/504; 313/509; 315/169.3
(58) Field of Classification Search .................. 313/583, 313/504, 506, 509, 512; 361/779; 315/169.1–169.4; 349/152
See application file for complete search history.

(56) References Cited

U.S. PATENT DOCUMENTS

| | | | | |
|---|---|---|---|---|
| 5,650,919 | A * | 7/1997 | Loh et al. | 361/779 |
| 2002/0024096 | A1* | 2/2002 | Yamazaki et al. | 257/359 |
| 2002/0101155 | A1* | 8/2002 | Kimura | 313/506 |
| 2002/0135312 | A1* | 9/2002 | Koyama | 315/169.3 |
| 2003/0189400 | A1 | 10/2003 | Nishio et al. | |
| 2003/0209983 | A1* | 11/2003 | Harada | 313/586 |
| 2004/0008314 | A1* | 1/2004 | Hayashi et al. | 349/158 |
| 2004/0121602 | A1* | 6/2004 | Maruyama et al. | 438/689 |
| 2004/0137142 | A1* | 7/2004 | Nishikawa | 427/66 |
| 2005/0134170 | A1* | 6/2005 | Otani et al. | 313/504 |
| 2005/0151462 | A1* | 7/2005 | Miyagawa | 313/500 |
| 2005/0184656 | A1* | 8/2005 | Kim et al. | 313/504 |
| 2006/0232197 | A1* | 10/2006 | Lee | 313/504 |
| 2006/0290271 | A1* | 12/2006 | Cok | 313/504 |
| 2009/0153765 | A1* | 6/2009 | Yamashita et al. | 349/58 |

FOREIGN PATENT DOCUMENTS

| | | |
|---|---|---|
| JP | 8-315981 | 11/1996 |
| JP | 09-161970 A | 6/1997 |
| JP | 2003-272832 | 9/2003 |
| JP | 3481232 B2 | 12/2003 |
| JP | 2004-235048 | 8/2004 |
| JP | 2005-174931 | 6/2005 |
| KR | 102000023402 A | 4/2000 |
| KR | 1020000060589 A | 10/2000 |
| KR | 1020000065701 A | 11/2000 |
| KR | 1020060042112 A | 5/2006 |
| WO | WO 2007039959 A1 * | 4/2007 |

OTHER PUBLICATIONS

Japanese Office Action for Application No. 2007-026585; dated Jan. 19, 2010, Samsung Mobile Display Co., Ltd., 3 pgs.
Korean Registration Determination Certificate of Patent for Invention Cert. No. 9-5-2008-012970014; issued Mar. 6, 2008, 4 pages.

* cited by examiner

*Primary Examiner* — Nimeshkumar D Patel
*Assistant Examiner* — Steven Horikoshi
(74) *Attorney, Agent, or Firm* — Knobbe Martens Olson & Bear LLP

(57) ABSTRACT

Provided is an organic light emitting display apparatus in which short circuit between conductive lines exposed outside a display unit is avoided. The organic light emitting display apparatus includes a substrate, a display unit disposed on the substrate, a plurality of conductive lines disposed on the substrate and extending in an edge direction of the substrate; an insulator filling the conductive lines; and a first spacer disposed on the insulator.

17 Claims, 9 Drawing Sheets

ORGANIC LIGHT EMITTING DISPLAY APPARATUS

CROSS-REFERENCE TO RELATED APPLICATION

This application claims the priority of Korean Patent Application No. 10-2006-0050875, filed on Jun. 7, 2006, in the Korean Intellectual Property Office, the disclosure of which is incorporated herein in its entirety by reference.

BACKGROUND

1. Field

The present invention relates to an organic light emitting display apparatus, and more particularly, to insulating between conductive lines of an organic light emitting display apparatus.

2. Discussion of the Related Technology

An organic light emitting display apparatus includes a substrate, a display unit on the substrate, and conductive lines extending from the display unit. In general, conductive lines are densely arranged in the organic light emitting display apparatus. In particular, the number of the conductive lines connected to the display unit may increases as the resolution of the display unit increases. The distance between the conductive lines may become smaller so that the conductive lines can be compacted in a limited space. The conductive lines may be damaged, for example, during manufacturing. Such damage may cause short circuit between the neighboring conductive lines.

The discussion in this section is to provide general background information, and does not constitute an admission of prior art.

SUMMARY

An aspect of the invention provides an organic light emitting display apparatus comprising: a substrate comprising a surface and an edge of the surface; a display unit disposed on the surface; a plurality of conductive lines disposed on the surface and extending from the display unit to the edge; an insulator interposed between two neighboring ones of the plurality of conductive lines, the insulator extending along the two neighboring conductive lines, and the insulator comprising a surface facing away from the substrate; and a bump formed on the surface of the insulator.

In the foregoing apparatus, the apparatus may further comprise a sealing member opposing the substrate such that the display unit is interposed between the substrate and the sealing member, that a first portion of the each neighboring conductive line is interposed between the substrate and the sealing member, and that a second portion of each neighboring conductive line is not interposed between the substrate and the sealing member, wherein the bump may extend along with the two neighboring conductive lines and may not interpose between the substrate and the sealing member. The insulator may contact both the two neighboring conductive lines. The surface of the insulator may be swollen away from the substrate. The apparatus may comprise a sealing member opposing to the first substrate such that the display unit is interposed between the substrate and the sealing member, wherein the display unit may comprise a plurality of pixels comprising a first pixel and a second pixel, a wall partitioning the first pixel and the second pixel, and a spacer disposed between the wall and the sealing member and wherein the spacer contacts or configured to contact the sealing member. The insulator may be formed of the same material as that of the wall. The bump may be formed of the same material as that of the spacer. The insulator and the wall may be connected to each other to form an integrated body. The bump and the spacer may be connected each other to form an integrated body.

Still in the foregoing apparatus, the bump may be formed of an electrically insulating material. The apparatus may further comprise a printed circuit board, wherein the conductive lines are connected to corresponding wirings of the printed circuit board while neither the bump nor insulator contacts the printed circuit board. The apparatus may further comprise an integrated circuit, wherein the conductive lines may be connected to corresponding wiring of the integrated circuit while neither the bump nor the insulator contacts the integrated circuit.

Another aspect of the invention provides organic light emitting display apparatus comprising: a substrate comprising a surface and an edge of the first surface; a display unit disposed on the first surface; a plurality of conductive lines disposed on the first surface and extending from the display unit to the edge of the substrate; a sealing member opposing the substrate such that the display unit is interposed between the substrate and the sealing member and comprising an edge; and a spacer formed along the edge of the sealing member, wherein the spacer comprising a bottom surface facing the first surface and a top surface facing away from the first surface, wherein a portion of the top surface contacts the sealing member while the remainder of the top surface does not contact the sealing member, and wherein the spacer and the substrate interpose a portion of each of the plurality of electrically conductive lines.

In the foregoing apparatus, the apparatus further comprises a seal interposed between the sealing member and the substrate and surrounding the display unit, wherein the spacer may be disposed outside the seal while the display unit is disposed inside the seal. The display unit comprises, a plurality of pixels comprising a first pixel and a second pixel, a wall partitioning the first pixel and the second pixel, and a second spacer disposed between the wall and the sealing member, wherein the spacer contacts or is configured to contact the sealing member. The spacer may be formed of the same material as that of the second spacer.

Yet another aspect of the invention provides an organic light emitting display device, comprising: a first substrate comprising a first surface and an edge of the first surface; a second substrate opposing the first substrate; an array of organic light emitting pixels interposed between the first substrate and the second substrate; a plurality of electrically conductive lines formed on the first substrate and extending from the array to the edge of the first substrate, wherein the plurality of electrically conductive lines comprises a first line and a second line; a partitioning wall comprising a portion interposed between the first line and the second line when viewed in a direction perpendicular to the first surface and configured to electrically insulate between the first line and the second line, wherein the partitioning wall comprises a top surface facing away from the first surface; and a bump projected from the top surface along the direction and interposed between the first line and the second line when viewed in the direction.

In the foregoing apparatus, the first line may comprise a top surface facing away from the first surface, and wherein the top surface of the partitioning wall may have an elevation from the first surface greater than that of the top surface of the first line. The bump may not contact the first or second line. Each of the first and second line may reach the edge, wherein the bump may not extend to the edge. The bump may not overlap with the second substrate when viewed in the direction. The plurality of electrically conductive lines may comprise a third line and a fourth line, wherein the device may further comprise a second partitioning wall comprising a portion interposed between the third line and the fourth line when viewed in the direction and configured to electrically insulate between the third line and the fourth line, wherein the second partitioning wall comprises a top surface facing away from the first surface, wherein the device may further comprise a second bump projected from the top surface of the second partitioning wall in the direction and interposed between the third line and the fourth line when viewed in the direction. There may be no intervening bump between the second line and the third line when viewed in the direction.

Still Another aspect of the present invention provides an organic light emitting display apparatus in which the short circuit between conductive lines exposed outside a display unit is prevented.

A further aspect of the present invention provides an organic light emitting display apparatus including: a substrate; a display unit disposed on the substrate; a plurality of conductive lines disposed on the substrate and extending in an edge direction of the substrate; an insulator filling the conductive lines; and a first spacer disposed on the insulator.

The organic light emitting display apparatus may further include a sealing member sealing the display unit, wherein the insulator and the first spacer correspond to portions of the conductive lines exposed outside the sealing member. The organic light emitting display apparatus may further include a sealing member sealing the display unit, wherein the first spacer corresponds to portions of the conductive lines exposed outside the sealing member. The insulator may cover side ends of the conductive lines. The insulator may have an upwardly protruded shape. The display unit may include: a plurality of pixel electrodes; a pixel defining layer covering edges of each pixel electrode and a space between the pixel electrodes so that a middle portion of each pixel electrode can be exposed; and a second spacer disposed on the pixel defining layer. The insulator may be formed of the same material as a material used in forming the pixel defining layer. The first spacer may be formed of the same material as a material used in forming the second spacer. The insulator may be disposed as a unitary body with the pixel defining layer. The first spacer may be disposed as a unitary body with the second spacer. The first spacer may be formed of an insulating material.

A PCB (printed circuit board) may be connected to end portions of the conductive lines, and the first spacer may correspond to portions of the conductive lines excluding the end portions connected to the PCB. A PCB (printed circuit board) may be connected to end portions of the conductive lines, and the insulator may correspond to portions of the conductive lines excluding the end portions connected to the PCB. An IC (integrated circuit) connected to the conductive lines may be further disposed on the substrate, and the first spacer may correspond to portions of the conductive lines excluding portions connected to the IC. An IC (integrated circuit) connected to the conductive lines may be further disposed on the substrate, and the insulator may correspond to portions of the conductive lines excluding portions connected to the IC.

A still further aspect of the present invention provides an organic light emitting display apparatus including: a substrate; a display unit disposed on the substrate; a plurality of conductive lines disposed on the substrate and extending in an edge direction of the substrate; a sealing member sealing the display unit; and a third spacer disposed between the sealing member and the substrate along an end surface of the sealing member.

The organic light emitting display apparatus may further include a sealant between the sealing member and the substrate along edges of the sealing member, wherein the third spacer is disposed outside the sealant. The third spacer may cover a vicinity of the end surface of the sealing member of the conductive lines along the end surface of the sealing member. The display unit may include: a plurality of pixel electrodes; a pixel defining layer covering edges of each pixel electrode and a space between the pixel electrodes so that a middle portion of each pixel electrode can be exposed; and a second spacer disposed on the pixel defining layer. The third spacer may be formed of the same material as a material used in forming the second spacer.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF EMBODIMENTS

Embodiments of the present invention will now be described more fully with reference to the accompanying drawings, in which exemplary embodiments of the invention are shown.

Figure 1:
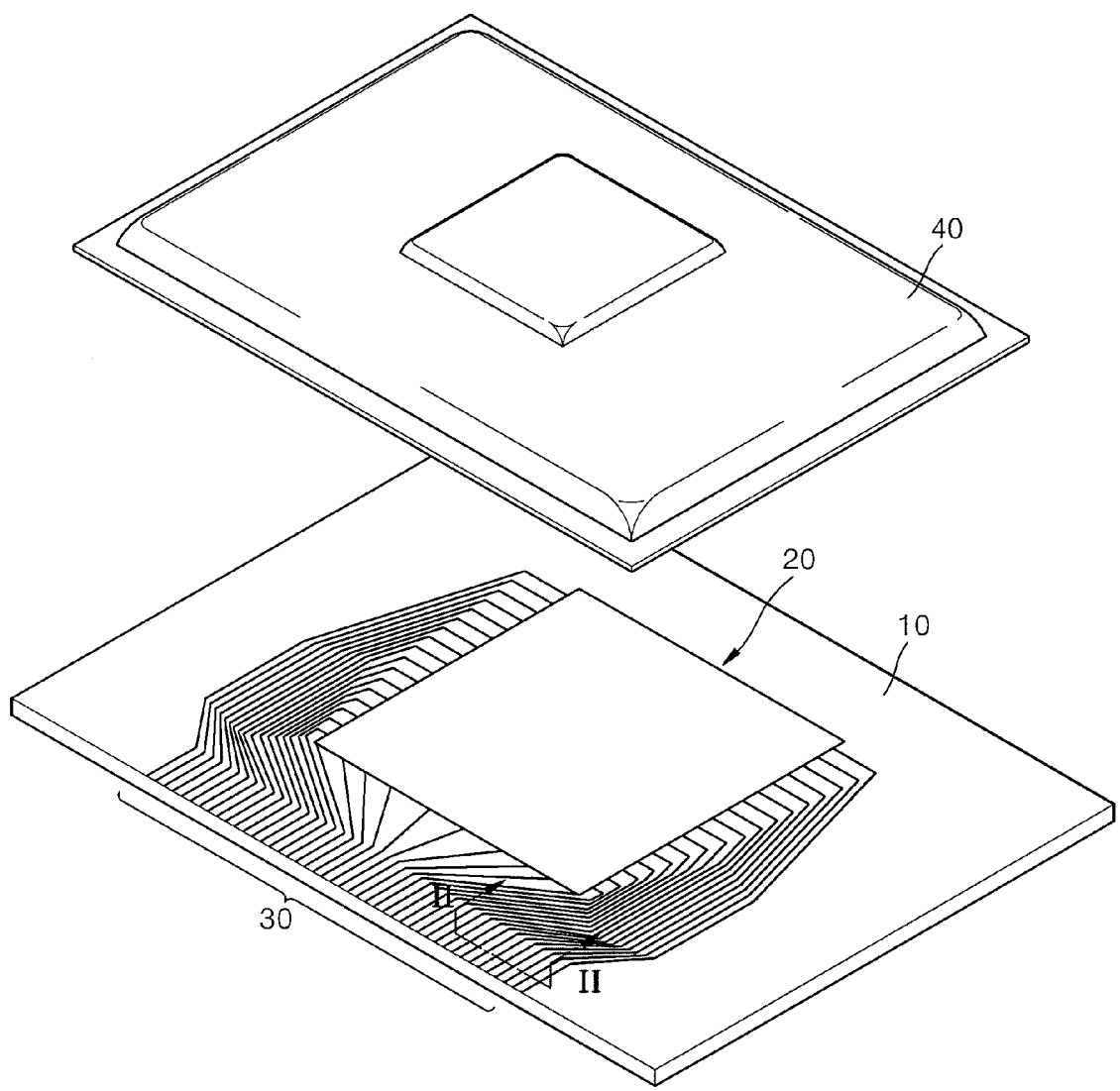
FIG. 1 is a schematic exploded perspective view of an exemplary organic light emitting display apparatus.
Figure 2A:
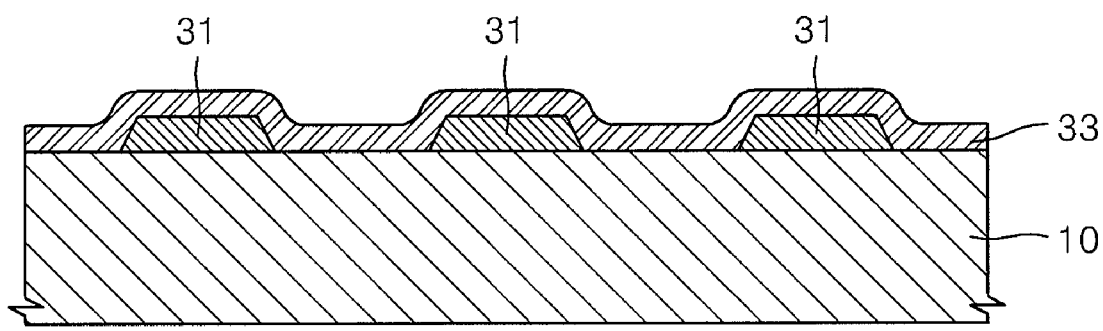
FIGS. 2A and 2B are schematic cross-sectional views taken along line II-II of FIG. 1.
Figure 2B:
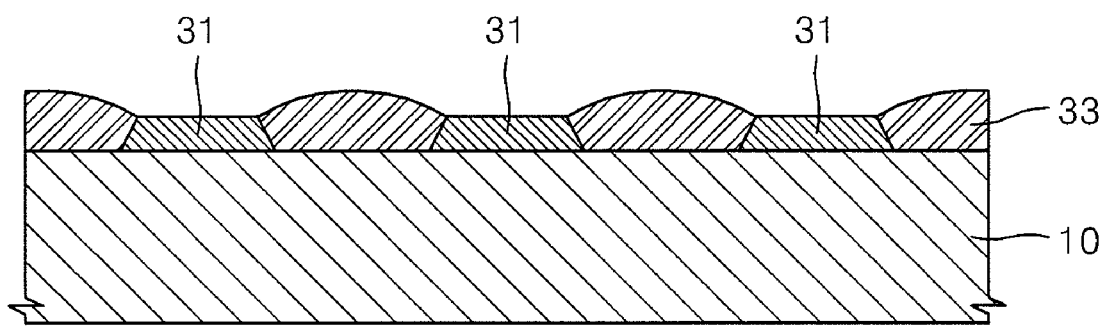
Figure 3:
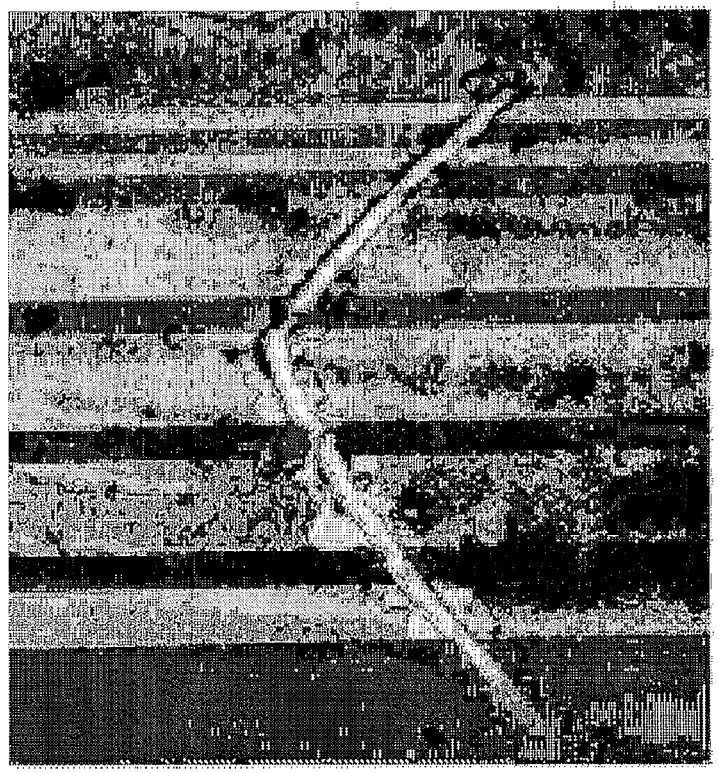
FIG. 3 is a photo showing a scratch occurred in terminal portions of the organic light emitting display apparatus of FIG. 1.

FIG. 1 is a schematic exploded perspective view of an exemplary organic light emitting display apparatus, FIGS. 2A and 2B are schematic cross-sectional views taken along line II-II of FIG. 1, and FIG. 3 is a photo showing that a scratch occurs in terminal portions of the organic light emitting display apparatus of FIG. 1.

Referring to FIGS. 1, 2A, and 2B, the exemplary organic light emitting display apparatus includes a substrate 10, a display unit 20 on the substrate 10, and an conductive line unit 30 that extends to the outside from the display unit 20. The conductive line unit 30 includes conductive lines 31 and a passivation layer 33 for covering the conductive lines 31, as illustrated in FIG. 2A, or includes conductive lines 31 and an insulator 33 for filling gaps between the conductive lines 31, as illustrated in FIG. 2B.

However, in the exemplary organic light emitting display apparatus, the conductive line unit 30 exposed outside a sealing member 40 may be damaged. In particular, as illustrated in FIG. 3, the conductive line unit 30 may be rasped away or scratched by a sharp object during or after manufacturing. In general, conductive lines are densely arranged in the conductive line unit 30, as illustrated in FIG. 1. Thus, when conductive lines is damaged by a sharp object, as illustrated in FIG. 3, there is a problem that a portion of a material used in forming conductive lines may be rasped away or moved and a short circuit may occur between the adjacent or neighboring conductive lines.

In particular, the number of the conductive lines connected to the display unit 20 increases as the resolution of the display unit 20 increases. Thus, a distance between the conductive lines becomes smaller so that the conductive lines can be disposed or compacted in a limited space. As such, when the conductive line unit 30 is damaged by the sharp object, a probability of the short circuit may increase.

Figure 4:
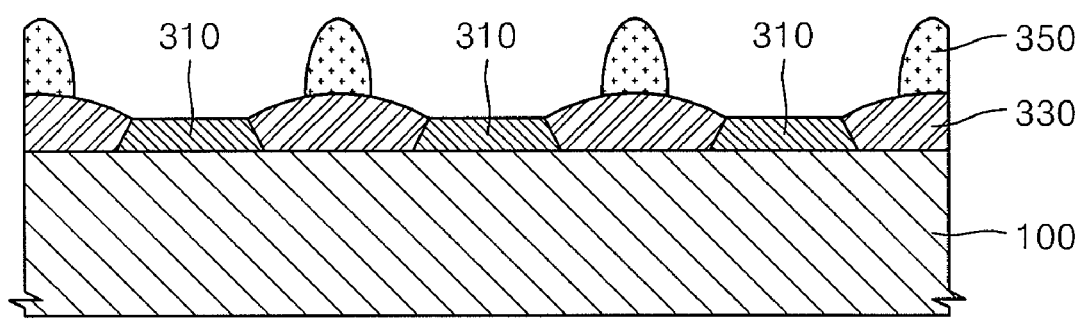
FIG. 4 is a schematic cross-sectional view of a portion of an organic light emitting display apparatus according to an embodiment of the present invention.

FIG. 4 is a schematic cross-sectional view of a portion of an organic light emitting display apparatus according to an embodiment of the present invention. The organic light emitting display apparatus of FIG. 4 includes a substrate 100, a display unit or an array of organic light emitting pixels (200, See FIG. 6) disposed on the substrate 100, and a plurality of electrically conductive lines (hereinafter "conductive lines") 310 disposed on the substrate 100 and extending in an edge direction of the substrate 100. Various types of plastic substrates such as acryl as well as a glass substrate may be used as the substrate 100, and furthermore, a metallic plate may also be used as the substrate 100. The conductive lines 310 are formed of various electrically conductive materials such as Mo, W, Al or Cu. The conductive lines 310 may be conductive lines extending from the display unit or conductive lines extending from a driver disposed outside the display unit. The display unit includes (sub)pixels each having an organic light emitting device. The structure of the display unit will be described later.

In addition, the organic light emitting display apparatus according to an embodiment includes an insulating partitioning wall or an insulator 330 filling gaps between the conductive lines 310, and a first spacer or bump 350 disposed on the insulator 330, as illustrated in FIG. 4. The insulator 330 may be formed of an insulating material such as silicon nitride, silicon oxide or acryl-based resin, and the first spacer 350 may also be formed of an insulating material having a mechanical strength, such as silicon nitride.

The conductive lines of the exemplary organic light emitting display apparatus discussed above may be damaged by a sharp object, and there is a problem that a conductive material used in forming conductive lines may be rasped away and the short circuit may occur in the adjacent conductive lines. However, in the organic light-emitting display apparatus according to the above discussed embodiment, the insulator 330 is formed between the conductive lines 310 and simultaneously, the first spacer or bump 350 is disposed on the insulator 330 so that the adjacent conductive lines 310 may be securely discriminated or partitioned from one another. As a result, even when the conductive lines 310 are damaged by a sharp material and a conductive material used in forming conductive lines is rasped away or moves, the rasped-off conductive material does not reach the adjacent conductive lines 310 and is blocked from moving beyond the insulator 330 and the first spacer 350. As such, the short circuit between the conductive lines 310 can be effectively prevented. In order to make this effect more secure, the insulator 330 may cover and contact side ends of the conductive lines 310 or may also protrude upwards.

Figure 5:
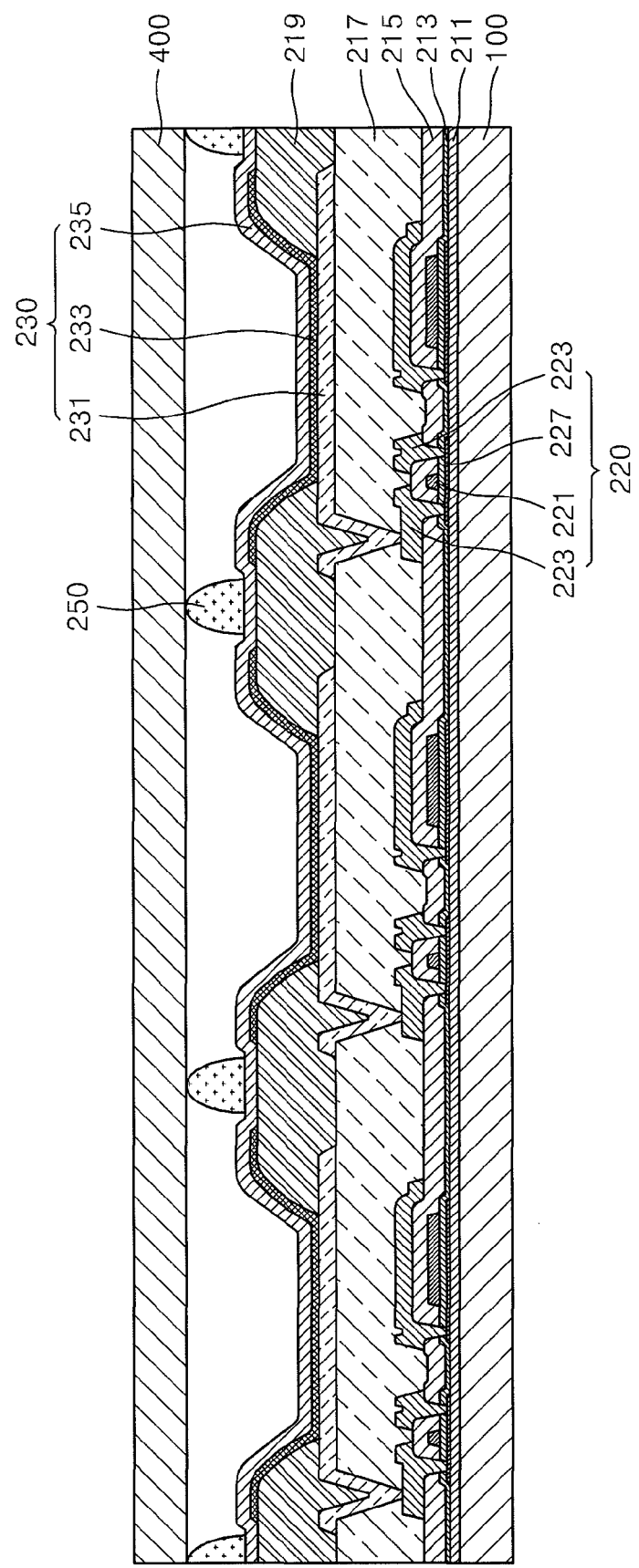
FIG. 5 is a schematic cross-sectional view of a portion of a display unit of the organic light emitting display apparatus illustrated in FIG. 4.

FIG. 5 is a schematic cross-sectional view of a portion of an organic light emitting display apparatus illustrated in FIG. 4. Referring to FIG. 5, thin film transistors 220 are disposed on the substrate 100, and an organic light emitting device 230 is disposed on the thin film transistors 220. The organic light emitting device 230 includes a pixel electrode 231 electrically connected to each thin film transistor 220, a facing electrode 235 disposed on the entire surface of the substrate 100, and an intermediate layer 233 disposed between the pixel electrode 231 and the facing electrode 235 and including at least a light emitting layer. Here, the pixel electrode 231 is an electrode disposed according to respective (sub)pixels.

The thin film transistors 220 are disposed on the substrate 100. Each thin film transistor includes a gate electrode 221, a source and drain electrode 223, a semiconductor layer 227, a gate insulator 213, and an inter-insulator 215. The thin film transistor 220 is not limited to the shape illustrated in FIG. 5, and various thin film transistors, such as an organic thin film transistor having a semiconductor layer 227 formed of an organic material and a silicon thin film transistor having a semiconductor layer 227 formed of silicon, may be used. A buffer layer 211 formed of silicon oxide or silicon nitride may also be further disposed between the thin film transistor 220 and the substrate 100, if necessary.

The organic light emitting device 230 includes a pixel electrode 231 and a facing electrode 235, which face each other, and an intermediate layer 233 formed of an organic material interposed between the pixel electrode 231 and the facing electrode 235. The intermediate layer 233 includes at least a light emitting layer and may include a plurality of layers. The layers will be described later. The pixel electrode 231 serves as an anode, and the facing electrode 235 serves as a cathode. The polarity of the pixel electrode 231 and the polarity of the facing electrode 235 may also be opposite to each other.

The pixel electrode 231 may be a transparent electrode or a reflective electrode. When the pixel electrode 231 is a transparent electrode, the pixel electrode 231 may be formed of ITO, IZO, ZnO or $In_2O_3$. When the pixel electrode 231 is a reflective electrode, the pixel electrode 231 may include a reflective film formed of Ag, Mg, Al, Pt, Pd, Au, Ni, Nd, Ir, Cr or a compound thereof, and a film formed of ITO, IZO, ZnO or $In_2O_3$.

The facing electrode 235 may also be a transparent electrode or a reflective electrode. When the facing electrode 235 is a transparent electrode, the facing electrode 235 may include a film in which Li, Ca, LiF/Ca, LiF/Al, Al, Mg or a compound thereof is deposited to direct toward the intermediated layer 233 between the pixel electrode 231 and the facing electrode 235, and an auxiliary electrode formed on the film using a material used in forming a transparent electrode such as ITO, IZO, ZnO or $In_2O_3$, or a bus electrode line. And, when the facing electrode 235 is a reflective electrode, the facing electrode 235 may be formed by depositing Li, Ca, LiF/Ca, LiF/Al, Al, Mg or a compound thereof.

A pixel defining layer (PDL) or pixel partitioning wall 219 covers edges 231a of the pixel electrode 231 and has a thickness toward the outside of the pixel electrode 231. That is, the PDL 219 covers edges of each pixel electrode 231 and a space 219a between the pixel electrodes 231 so that a middle portion 231b of each pixel electrode 231 can be exposed. The PDL 219 defines a light emitting region and prevents the short circuit between the pixel electrode 231 and the facing electrode 235 by preventing a phenomenon that an electric field is concentrated on edges of the pixel electrode 231 by widening a distance between the edges of the pixel electrode 231 and the facing electrode 235.

Various types of intermediate layers 233 including at least a light emitting layer are disposed between the pixel electrode 231 and the facing electrode 235. The intermediate layer 233 may be formed of a small molecular weight organic material or a polymer organic material. When a small molecular weight organic material is used in the intermediate layer 233, the intermediate layer 233 may be formed by stacking a hole injection layer (HIL), a hole transport layer (HTL), an emission layer (EML), an electron transport layer (ETL), and an electron injection layer (EIL) in a single or composite structure. Various small molecular weight organic materials such as copper phthalocyanine (CuPc), N,N'-Di(naphthalene-1-yl)-N,N'-diphenyl-benzidine (NPB), and tris-8-hydroxyquinoline aluminum (Alq3) may be used. These small molecular weight organic materials may be formed through vapor deposition using a mask. When a polymer organic material is used in the intermediate layer 233, the intermediate layer 233 may usually include an HTL and an EML. In this case, PEDOT is used in the HTL and a poly-phenylenevinylene (PPV)-based polymer organic material and a polyfluorene-based polymer organic material are used in the EML.

The organic light emitting device 230 is electrically connected to the thin film transistor 220 under the organic light emitting device 230. In this case, when a planarization layer 217 for covering the thin film transistor 220 is disposed, the organic light emitting device 230 is disposed on the planarization layer 217, and the pixel electrode 231 of the organic light emitting device 230 is electrically connected to the thin film transistor 220 through a contact hole formed in the planarization layer 217.

The organic light emitting device 230 formed on the substrate 100 is sealed by a sealing member 400. The sealing member 400 may be formed of various materials such as glass or plastics. A second spacer 250 is formed on the facing electrode 235. The second spacer 250 prevents the sealing member 400 from contacting the facing electrode 235 under the sealing member 400 and the facing electrode 235 or the PDL 219 under the sealing member 400 or the intermediate layer 233 from being damaged when shocks act on the sealing member 400.

In the above structure, for process conveniences, the insulator 330 for filling a space between the conductive lines 310 shown in FIG. 4 may be formed simultaneously with the PDL 219 shown in FIG. 5. In this case, the insulator 330 may be formed of the same material as a material used in forming the PDL 219 shown in FIG. 5. In addition, the first spacer or bump 350 show in FIG. 4 may be formed simultaneously with the second spacer 250 shown in FIG. 5. In this case, the first spacer 350 may be formed of the same material as a material used in forming the second spacer 250.

As illustrated in FIG. 5, besides the PDL 219, the gate insulator 213, the inter-insulator 215, and the planarization layer 217 are formed of an insulating material. Thus, various modifications that the insulator 330 show in FIG. 4 may also be formed when the gate insulator 213, the inter-insulator 215 or the planarization layer 217 is formed, are possible. However, the conductive lines 310 shown in FIG. 4 may be formed when the gate electrode 211, the source and drain electrode 223 or the pixel electrode 231 illustrated in FIG. 5 is formed, if necessary. Thus, the insulator 330 shown in FIG. 4 may be formed after all of the conductive lines 310 shown in FIG. 4 are formed. To this end, the insulator 330 shown in FIG. 4 may be formed when the PDL 219 of the display unit is formed. In addition, the insulator 330 shown in FIG. 4 is formed to fill the conductive lines 310. Thus, a patterning process may be necessary. Thus, it will also be more effective to form the insulator 330 shown in FIG. 4 when the PDL 219 requiring the patterning process is formed.

As described above, for the sake of process conveniences, when the insulator 330 for filling a space between the conductive lines 310 shown in FIG. 4 is formed simultaneously with the PDL 219 shown in FIG. 5, the insulator 330 shown in FIG. 4 may also be formed as a unitary body with the PDL 219 shown in FIG. 5. In addition, even when the first spacer 350 shown in FIG. 4 is formed simultaneously with the second spacer 250 shown in FIG. 5, the first spacer 350 and the second spacer 250 may also be formed as a unitary body, if necessary. In the latter case, the second spacer 250 in the display unit may have the same shape as that of a grid, if necessary.

Figure 6:
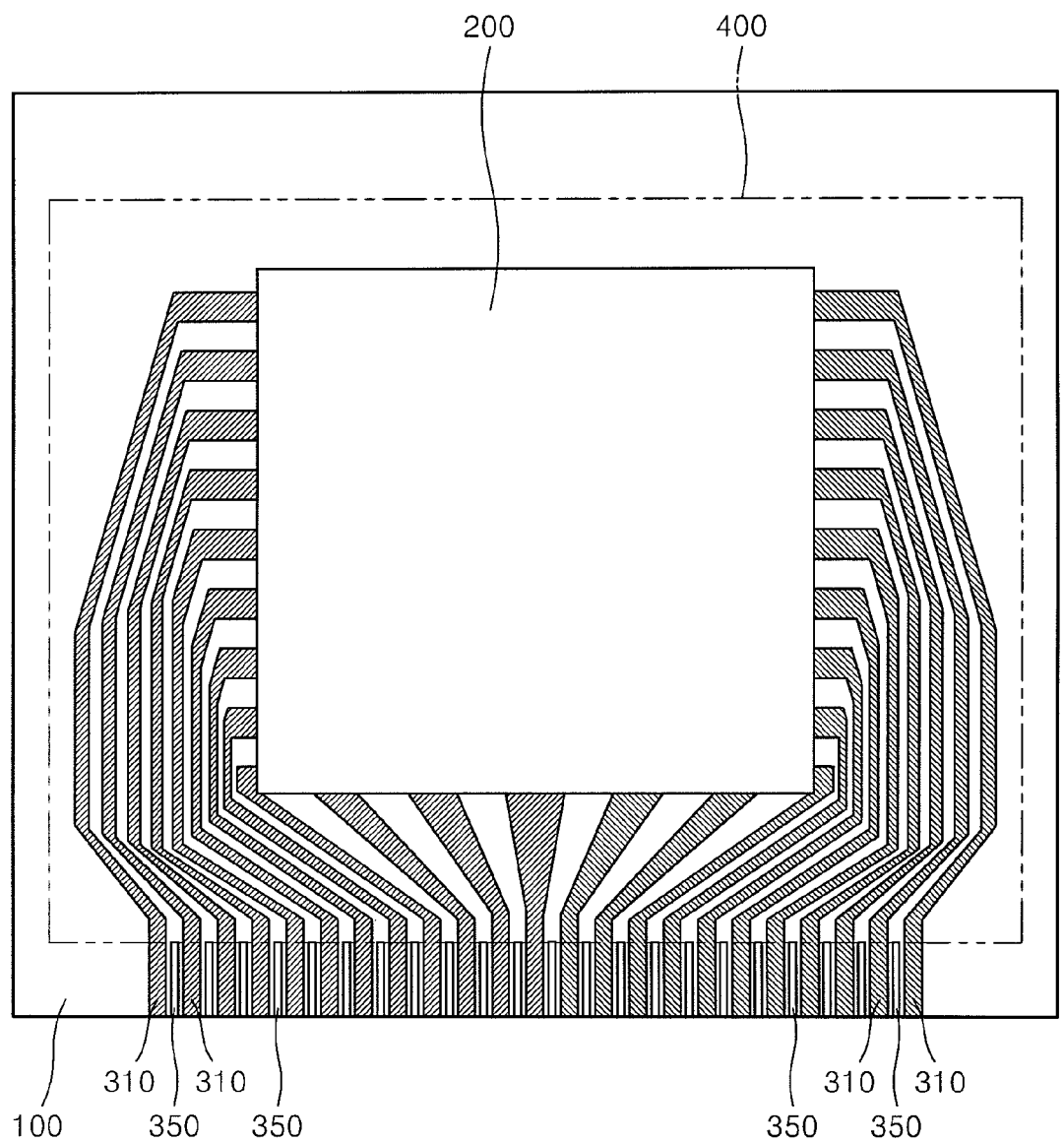
FIG. 6 is a schematic plan view of an organic light emitting display apparatus according to an embodiment of the present invention.

FIG. 6 is a schematic plan view of an organic light emitting display apparatus according to an embodiment of the present invention. As described above, an insulator (not shown in FIG. 6) and the first spacer 350 prevent a conductive material used in forming the conductive lines 310 from being rasped off and moving and prevent the short circuit from occurring between the adjacent conductive lines 310 when the conductive lines 310 are damaged. A danger that the conductive lines 310 may be damaged is greater in a portion exposed outside the sealing member 400, in particular. Thus, in the embodiment illustrated in FIG. 6, the first spacer 350 may be formed only on an area exposed outside the sealing member 400. Furthermore, the insulator between the conductive lines 310 may also be formed only the area exposed outside the sealing member 400. In FIG. 6, the conductive lines 310 are shown to extend only from the display unit 200. However, various modifications that a driver may be further disposed outside the display unit 200 and the conductive lines 310 may extend from the driver, are possible.

Figure 7:
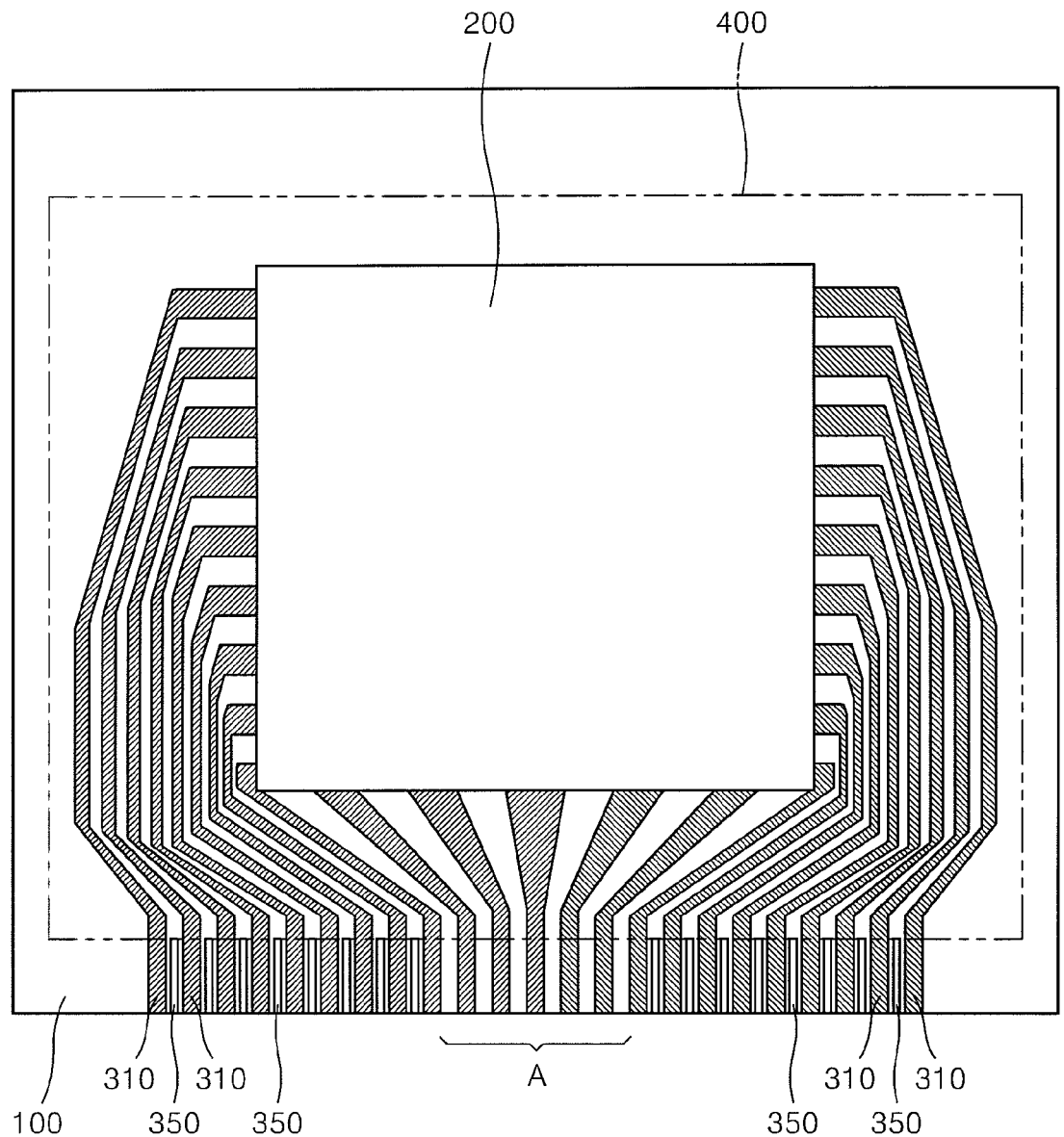
FIG. 7 is a schematic plan view of an organic light emitting display apparatus according to an embodiment of the present invention.

FIG. 7 is a schematic plan view of an organic light emitting display apparatus according to an embodiment of the present invention. Referring to FIG. 7, there is no intervening first spacer or bump 350 between the conductive lines 310 disposed at a portion A shown in FIG. 7. The portion A is the portion in which an integrated circuit (IC) may be directly disposed on the substrate 100, and the height of the intervening structure disposed between the conductive lines 310 may be smaller than that of the conductive lines so that terminals of the IC and the conductive lines can be electrically and securely connected to each other. That is, the IC has bumps for contacting the conductive lines 310. Thus, the bumps of the IC contact a plurality of conductive lines 310. In this case, if the height of the structure disposed between the conductive lines 310 is greater than that of the conductive lines, the bumps of the IC may not be able to contact the conductive lines 310. Thus, in order to avoid such defects, the first spacer 350 may not be formed on a portion A to be connected to the IC. That is, the first spacer 350 may be formed only at an area excluding the portion A. An insulator may also be formed only at an area excluding the portion A.

Figure 8:
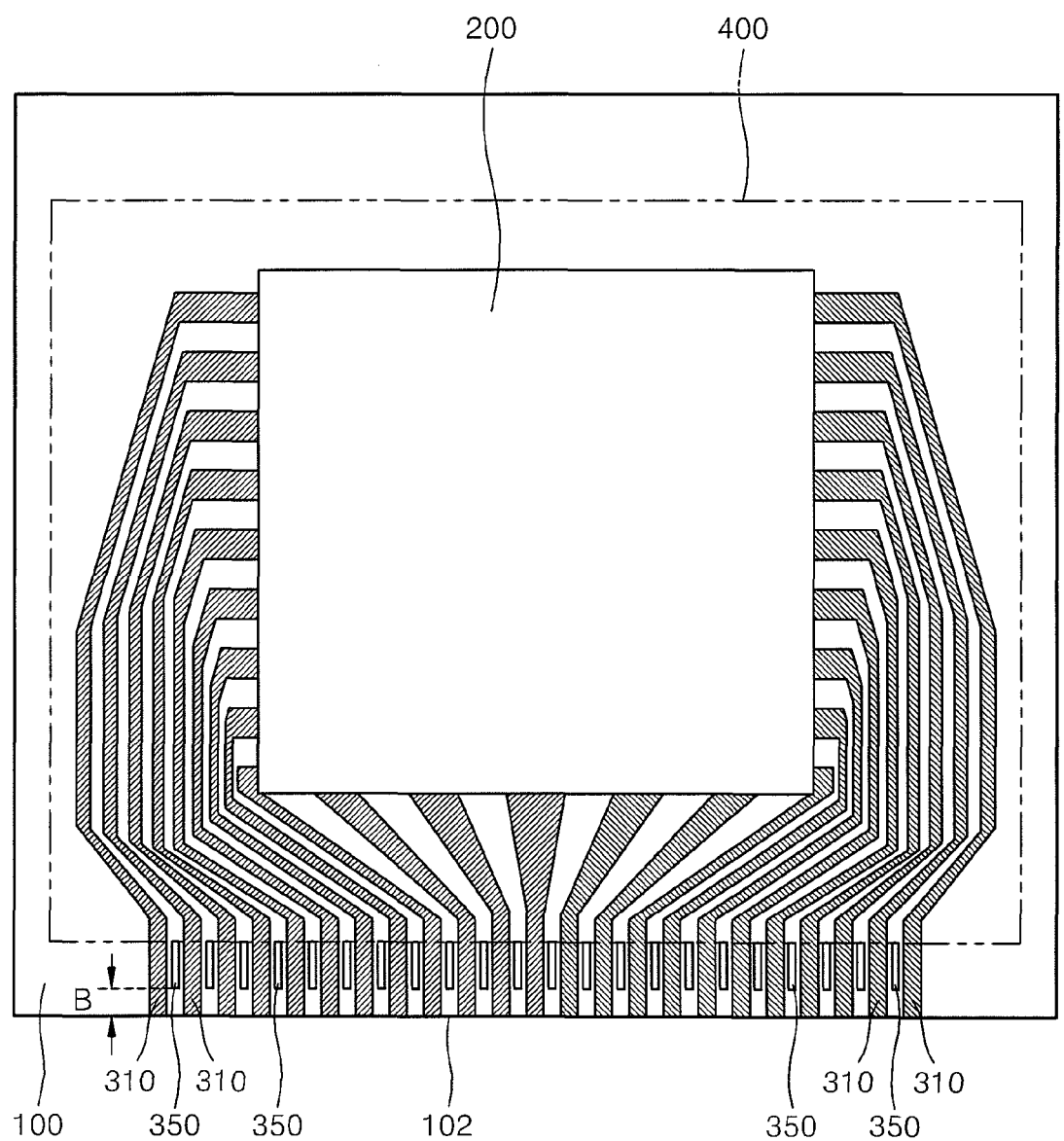
FIG. 8 is a schematic plan view of an organic light emitting display apparatus according to an embodiment of the present invention.

FIG. 8 is a schematic plan view of an organic light emitting display apparatus according to an embodiment of the present invention. Referring to FIG. 8, the first spacer 350 is not disposed on a portion B shown in FIG. 8. That is, the first spacer 350 is not formed or disposed in the vicinity of a front edge 102 of the substrate 100. The portion B is the portion to which a printed circuit board (PCB) may be attached, and the height of an intervening structure disposed between the conductive lines 310 may be smaller than that of the conductive lines so that terminals of the PCB and the conductive lines can be electrically and securely connected to each other. That is, the PCB has bumps for contacting the conductive lines 310. Thus, of the bumps of the PCB contact the conductive lines 310. In this case, if the height of the intervening structure disposed between the conductive lines 310 is greater than that of the conductive lines, the bumps of the PCB may not be able to contact the conductive lines 310. Thus, in order to avoid such defects, the first spacer 350 may not be formed or may not extend in the area B which is the vicinity of the edge of the substrate 100. That is, the first spacer 350 may be formed only in an area excluding the area B. An insulator may also be formed only in an area excluding the area B.

Figure 9:
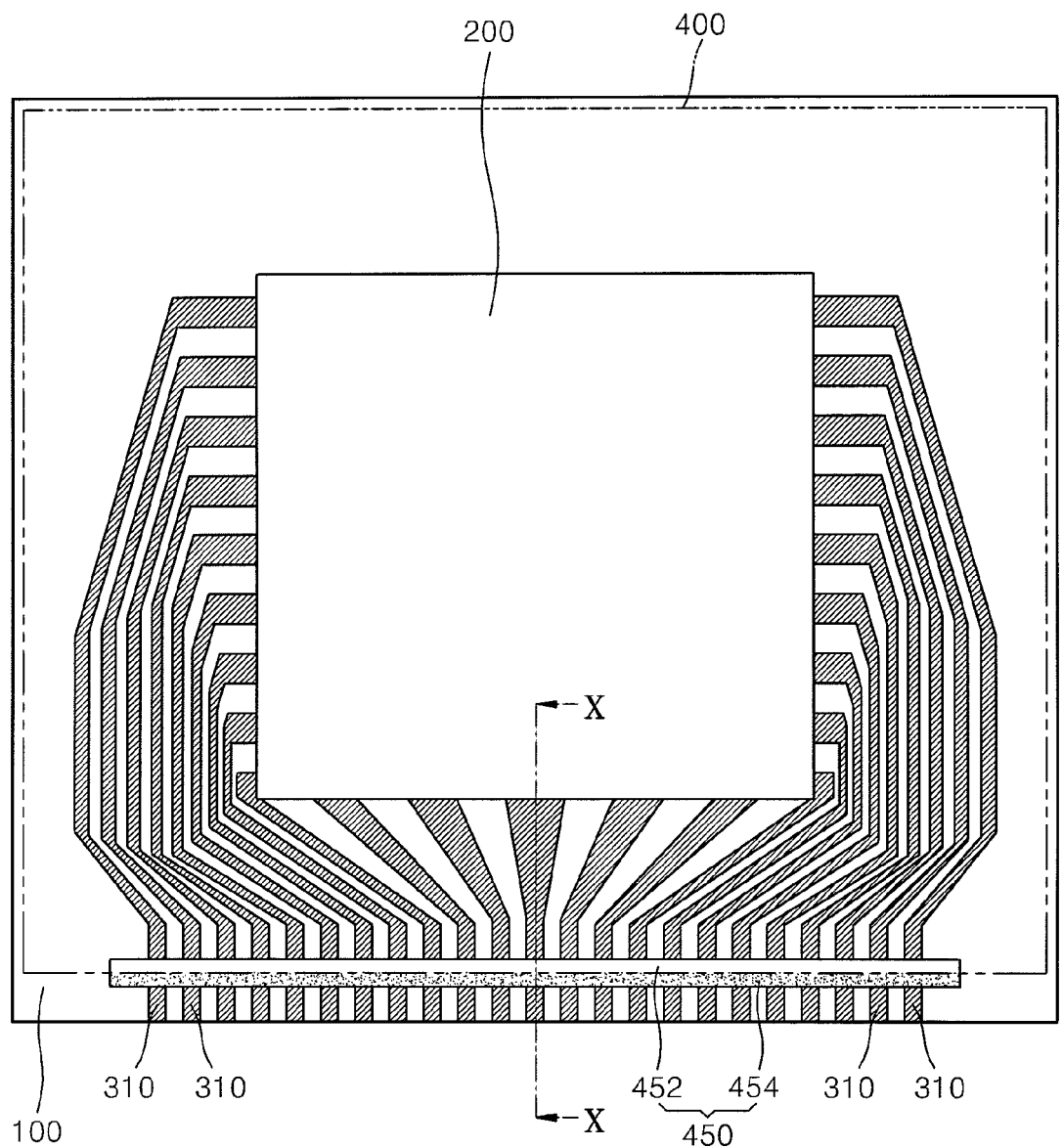
FIG. 9 is a schematic plan view of an organic light emitting display apparatus according to an embodiment of the present invention.
Figure 10:
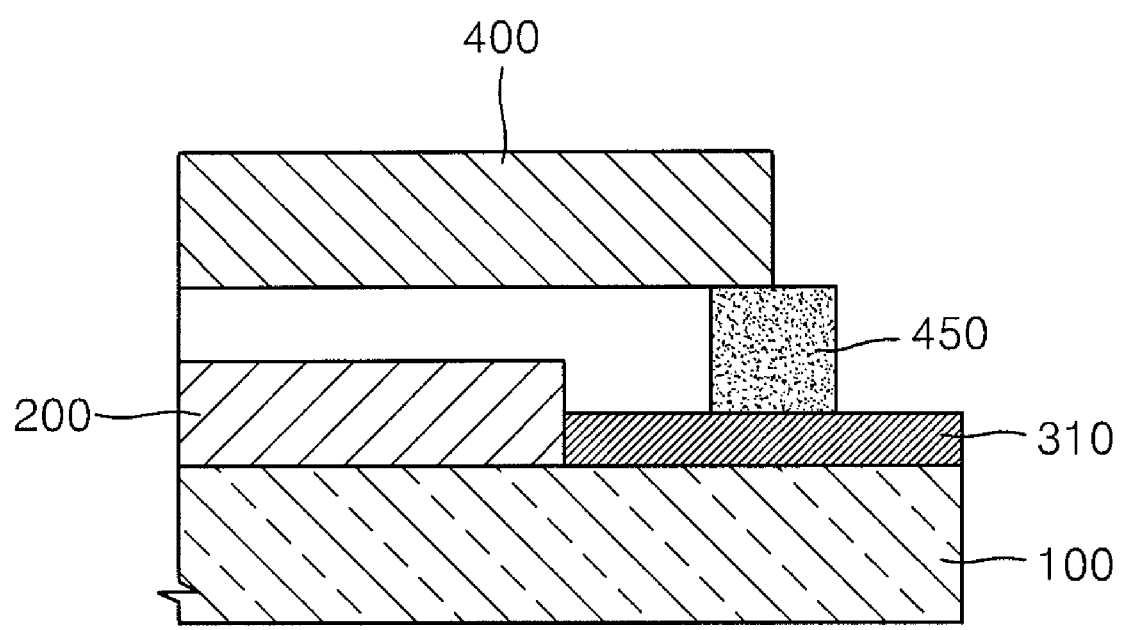
FIG. 10 is a sectional view taken along a line X-X in FIG. 9.

FIGS. 9 and 10 is a schematic plan view and a sectional view of an organic light emitting display apparatus according to an embodiment of the present invention, respectively. Referring to FIG. 9, the organic light emitting display apparatus according to the present embodiment includes a third spacer 450. The third spacer 450 is disposed between the sealing member 400 and the substrate 100 and extends along an edge of the sealing member 400. The third spacer has a first portion 452 overlapping with the sealing member and has a second portion 454 which does not overlap with the sealing member. In FIG. 9, the third spacer 450 is disposed only along the edge of the sealing member 400. However, various modifications that the third spacer 450 may be disposed along all edges of the sealing member 400, are possible.

When the organic light emitting display apparatus is manufactured, only one organic light emitting display panel may also be manufactured. However, a plurality of organic light emitting display panels may be simultaneously manufactured so as to reduce manufacturing costs. In the latter case, a plurality of display units are formed on one large size substrate, a one large size sealing member for covering the plurality of display units is combined with the large size substrate and then the large size substrate and the large size sealing member are cut along a cutting line disposed outside each display unit, thereby manufacturing the plurality of organic light emitting display panels. In this case, in each organic light emitting display unit, the size of the sealing member is equal to the size of the substrate such that the sealing member covers the entire surface of the substrate.

After the plurality of organic light emitting display panels are manufactured in this way, in each organic light emitting display panel, end portions of the conductive lines 310 need to be exposed outside the sealing member 400 to provide electric connection with the other device, as illustrated in FIG. 9. Thus, a portion of a sealing member covering the portion in which the conductive lines 310 are to be exposed, is removed so that a portion of the conductive lines 310 can be exposed outside the sealing member, as illustrated in FIG. 9. As a result, the edge of the sealing member 400 is formed as illustrated in FIG. 9.

In this case, when a portion of the sealing member 400 is removed, the conductive lines 310 to be exposed outside the sealing member 400 may also be damaged during the removing process. Thus, in order to avoid this problem, the third spacer 450 is disposed along a cutting line of the sealing member 400 (which will be the edge of the sealing member 400 after cutting). As such, when cutting the sealing member 400, the third spacer 450 protects the conductive lines 310 from being damaged.

The third spacer 450 is a different structure from a seal (not shown) which combines the substrate 100 and the sealing member 400. The seal or sealant is disposed between the sealing member 400 and the substrate 100 along all edges of the sealing member 400. The third spacer 450 is disposed outside the sealant. That is, the sealant is disposed between the third spacer 450 and the display unit 200.

As described above, a pixel defining layer (PDL) and a second spacer disposed on the PDL may be disposed on the display unit 200. In an embodiment, the third spacer 450 may be formed of the same material as the material of the second spacer. In another embodiment, the first spacer illustrated in FIG. 8 and the third spacer shown in FIG. 9 may also be formed together. In this case, a modification that the first spacer and the third spacer 450 may form a single body, are possible.

As described above, in the organic light emitting display apparatus according to embodiments of the present invention, the organic light emitting display apparatus in which the short circuit between conductive lines exposed outside the display unit can be avoided.

While embodiments of the present invention has been particularly shown and described, it will be understood by those of ordinary skill in the art that various changes in form and details may be made therein without departing from the spirit and scope of the present invention as defined by the following claims.

What is claimed is:

1. An organic light emitting display apparatus comprising:
   a substrate comprising a surface and an edge of the surface;
   a display unit disposed on the surface;
   a plurality of conductive lines disposed on the surface and extending from the display unit to the edge;
   an insulator interposed between two neighboring ones of the plurality of conductive lines, the insulator extending along the two neighboring conductive lines, and the insulator comprising a surface facing away from the substrate;
   a discrete bump formed on the surface of the insulator, wherein the bump does not contact the surface of the substrate; and
   a sealing member opposing the substrate such that the display unit is interposed between the substrate and the sealing member, that a first portion of the each neighboring conductive line is interposed between the substrate and the sealing member, and that a second portion of each neighboring conductive line is not interposed between the substrate and the sealing member, wherein the bump extends along with the two neighboring conductive lines and is not interposed between the substrate and the sealing member.

2. The organic light emitting display apparatus of claim 1, wherein the insulator contacts both the two neighboring conductive lines.

3. The organic light emitting display apparatus of claim 1, wherein the surface of the insulator is swollen away from the substrate.

4. The organic light emitting display apparatus of claim 1, further comprising a sealing member opposing to the first substrate such that the display unit is interposes between the substrate and the sealing member, wherein the display unit comprises:
   a plurality of pixels comprising a first pixel and a second pixel;
   a wall partitioning the first pixel and the second pixel; and
   a spacer disposed between the wall and the sealing member and wherein the spacer contacts or configured to contact the sealing member.

5. The organic light emitting display apparatus of claim 4, wherein the insulator is formed of the same material as that of the wall.

6. The organic light emitting display apparatus of claim 4, wherein the bump is formed of the same material as that of the spacer.

7. The organic light emitting display apparatus of claim 5, wherein the insulator and the wall are connected to each other to form an integrated body.

8. The organic light emitting display apparatus of claim 6, wherein the bump and the spacer are connected to each other to form an integrated body.

9. The organic light emitting display apparatus of claim 1, wherein the bump is formed of an electrically insulating material.

10. The organic light emitting display apparatus of claim 1, further comprising a printed circuit board, wherein the conductive lines are connected to corresponding wirings of the printed circuit board while neither the bump nor insulator contacts the printed circuit board.

11. The organic light emitting display apparatus of claim 1, further comprising an integrated circuit, wherein the conductive lines are connected to corresponding wiring of the integrated circuit while neither the bump nor the insulator contacts the integrated circuit.

12. An organic light emitting display device, comprising:
a first substrate comprising a first surface and an edge of the first surface;
a second substrate opposing the first substrate;
an array of organic light emitting pixels interposed between the first substrate and the second substrate;
a plurality of electrically conductive lines formed on the first substrate and extending from the array to the edge of the first substrate, wherein the plurality of electrically conductive lines comprises a first line and a second line;
a partitioning wall comprising a portion interposed between the first line and the second line when viewed in a direction perpendicular to the first surface and configured to electrically insulate between the first line and the second line, wherein the partitioning wall comprises a top surface facing away from the first surface; and
a discrete bump projected from the top surface along the direction and interposed between the first line and the second line when viewed in the direction, wherein the bump does not contact the first surface of the first substrate
wherein the bump does not overlap with the second substrate when viewed in the direction perpendicular to the first surface.

13. The device of claim 12, wherein the first line comprises a top surface facing away from the first surface, and wherein the top surface of the partitioning wall has an elevation from the first surface greater than that of the top surface of the first line.

14. The device of claim 12, wherein the bump does not contact the first or second line.

15. The device of claim 12, wherein each of the first and second lines reaches the edge, wherein the bump does not extend to the edge.

16. The device of claim 12, wherein the plurality of electrically conductive lines comprises a third line and a fourth line, wherein the device further comprises a second partitioning wall comprising a portion interposed between the third line and the fourth line when viewed in the direction and configured to electrically insulate between the third line and the fourth line, wherein the second partitioning wall comprises a top surface facing away from the first surface, wherein the device further comprises a second bump projected from the top surface of the second partitioning wall in the direction and interposed between the third line and the fourth line when viewed in the direction perpendicular to the first surface.

17. The device of claim 16, wherein there is no intervening bump between the second line and the third line when viewed in the direction perpendicular to the first surface.

* * * * *